United States Patent [19]

Crossley et al.

[11] Patent Number: 4,644,296

[45] Date of Patent: Feb. 17, 1987

[54] CONTROLLING OSCILLATOR

[75] Inventors: Ian Crossley, Andover; Daniel Donoghue, Tewksbury; Robert Goldswasser, Andover, all of Mass.; John Miley, Hollis, N.H.; Frank Spooner, Concord, Mass.

[73] Assignee: Charles Hieken, Woburn, Mass.

[21] Appl. No.: 726,091

[22] Filed: Apr. 23, 1985

[51] Int. Cl.⁴ .......................... H03L 7/00; H03L 7/02
[52] U.S. Cl. ...................................... 331/1 R; 331/9; 331/15
[58] Field of Search ................. 331/1 R, 15, 16, 36 C, 331/177 V, 9

[56] References Cited

U.S. PATENT DOCUMENTS 4,336,505  6/1982  Meyer .................................. 331/1 R
4,535,358  8/1985  Duijkers ........................ 331/1 R X Primary Examiner—Eugene R. LaRoche
Assistant Examiner—James C. Lee
Attorney, Agent, or Firm—Charles Hieken

[57] ABSTRACT

A voltage controlled oscillator includes a VCO chip that is a monolithic circuit with a Gunn diode and varactor diode intercoupled by a resonant circuit. A detector/discriminator/power divider chip is coupled to the VCO chip through a directional coupler and is a monolithic circuit having a pair of discriminator diodes and amplitude detector diode on a semi-insulating substrate with associated circuit components. Connected-together electrodes of the discriminator diodes are connected to one output of the power divider. An electrode of the amplitude detector diode is connected to the other output of the power divider. Stagger-tuned resonant circuits are coupled to the other electrodes of the discriminator diodes. Conducting portions forming low pass filters couple the amplitude detector diode and the discriminator detector diodes to respective outputs. The outputs of the discriminator and amplitude detector are coupled to respective inputs of an analog divider that provides a ratio signal that is coupled to the − input of a differential amplifier. The + input of the differential amplifier receives a frequency designating potential. The output of the differential amplifier is coupled to the varactor diode.

6 Claims, 10 Drawing Figures

CONTROLLING OSCILLATOR

The present invention relates in general to signal generating and more particularly concerns novel apparatus and techniques for controlling the frequency of an oscillator in the millimeter wave frequency range with exceptionally compact structure capable of being implemented in monolithic circuitry. The invention affords good frequency control with an amplitude insensitive system free of conventional limiters that is especially advantageous at millimeter wave frequencies and also useful at any frequency. Furthermore, novel monolithic circuitry according to the invention provides advantageous thermal, electrical and mechanical properties.

It is an important object of the invention to provide improved apparatus and techniques for signal generation.

According to the invention, there is oscillatory circuit means having a frequency controlling signal input for receiving a frequency controlling signal for controlling the frequency of oscillation of the oscillatory circuit, means for providing a feedback signal representative of the amplitude and freqency of the output signal provided by the oscillatory circuit means, discriminating means responsive to the feedback signal for providing an output signal representative of both frequency and amplitude of the output signal, amplitude detecting means for providing a signal representative of only the amplitude of the output signal, dividing means for combining the latter two signals to provide a ratio signal representative of the frequency of the output signal independently of its amplitude, and means for combining the ratio signal with a frequency designating signal to provide the control signal to maintain the frequency of the output signal substantially corresponding to that designated by the frequency designating signal.

In a specific form of the invention, the source of the feedback signal comprises a directional coupler coupled to power dividing means that provides a signal over parallel paths to the frequency discriminating means and the amplitude detecting means free of limiters. Preferably the oscillatory circuit means comprises a varactor diode and Gunn diode in a monolithic circuit including resonant circuit means for establishing the frequency of oscillation. A pair of diodes comprising the frequency discriminating means, a diode comprising the amplitude detecting means and conductors defining the power dividing means and transmission lines intercoupling the power dividing means, frequency discriminating means, and amplitude detecting means comprises a monolithic circuit.

Numerous other features, objects and advantages of the invention will become apparent from the following specification when read in connection with the accompanying drawing in which.

Figure 1:
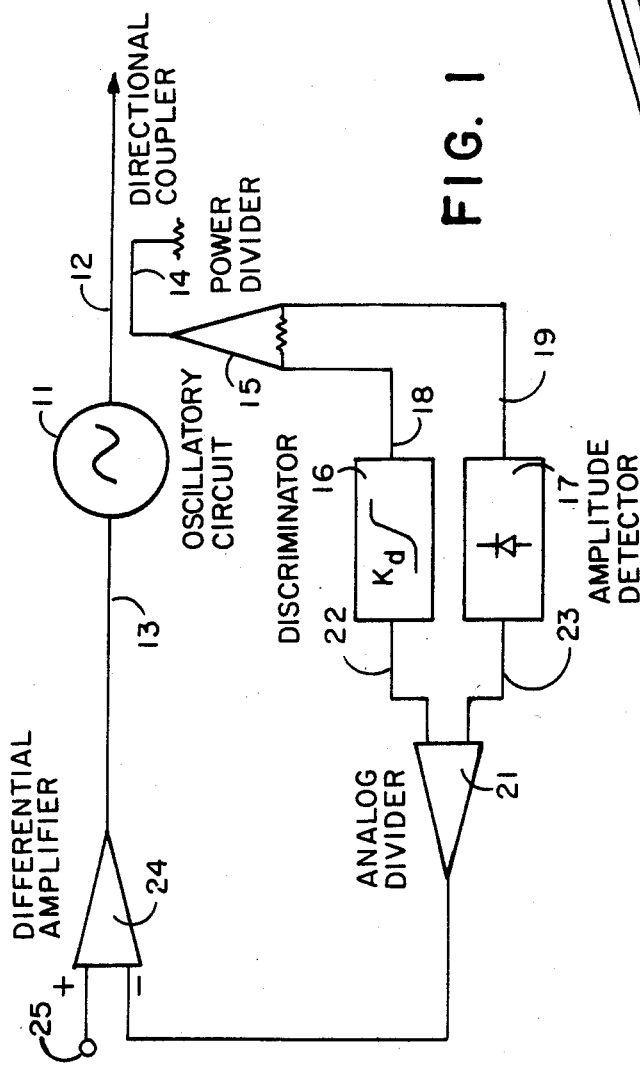
FIG. 1 is a combined block-schematic diagram of an embodiment of the invention.

With reference now to the drawing and more particularly FIG. 1 thereof, there is shown a combined block-schematic circuit diagram of an exemplary embodiment of the invention. An oscillatory circuit 11, typically comprising a varactor diode, Gunn diode and resonant circuit, has an output branch 12 that provides an output signal of controlled frequency in response to a control signal received on control signal input 13. A directional coupler 14 receives a small portion of the output signal on output 12 and delivers it to power divider 15. The signals from power divider 15 are coupled to discriminator 16 and amplitude detector 17 by transmission lines 18 and 19, respectively.

The signals from discriminator 16 and amplitude detector 17 are coupled to analog divider 21 by lines 22 and 23, respectively. The output of divider 21 is coupled to the − input of differential amplifier 24. The + input of differential amplifier 24 receives a frequency designating signal on terminal 25. The output of differential amplifier 24 is coupled to the frequency controlling input of oscillatory circuit 11.

Having described the structural arrangement of the circuit, its mode of operation will be described. Oscillatory circuit 11, typically comprising a varactor diode, Gunn diode and resonant circuit, provides a signal on output line 12, a fraction of which is coupled by directional coupler 14 to power divider 15. Directional coupler 14 provides relatively loose coupling to power divider 15 so that the oscillatory circuit 11 and its output are not adversely affected by the load connected to directional coupler 14 through power divider 15.

Power divider 15 takes the feedback signal provided by directional coupler 14 and divides it preferably substantially equally for delivery over transmission lines 18 and 19 to discriminator 16 and amplitude detector 17, respectively. Discriminator 16 typically comprises staggered tuned circuits arranged in a known manner to produce an S curve having a zero crossover at a predetermined center frequency typically at the center of the tuning range of oscillatory circuit 11. This signal $V_d$ is representative of both the amplitude and frequency of the output signal on output line 12, there being no limiter. Amplitude detector 17 provides a signal $V_p$ representative of only the amplitude of the output signal on output line 12. Analog divider 21 combines the signals from discriminator 16 and amplitude detector 17 to provide a ratio signal that is delivered to the − input of differential amplifier 24 reprsentative of only the frequency of the output signal on output line 12, independently of its amplitude.

Differential amplifier 24 combines this ratio signal with the frequency designating signal $V_T$ applied to terminal 25 connected to the + input of differential amplifier 24 to provide a frequency controlling signal on frequency controlling line 13 that adjusts the frequency of oscillator circuit 11 until the difference between $V_T$ and the ratio signal is substantially zero. Since discriminator 16 is characterized by a linear relationship as a function of frequency for a significant bandwidth between the resonant frequencies of the staggered tuned circuits, this circuitry establishes a linear relationship between the voltage on terminal 25 and the frequency on output line 12.

Although the invention is useful at all frequencies, it is especially useful at millimeter wave frequencies. It was discovered that limiting circuitry cascaded with a discriminator would not operate satisfactorily for frequency control. To develop adequate power for good limiting, coupling might have to be increased so that it would interfere with the impedance characteristics of the output circuit and/or reduce efficiency by diverting useful power from the local oscillator output to the frequency controlling circuitry.

Figure 2:
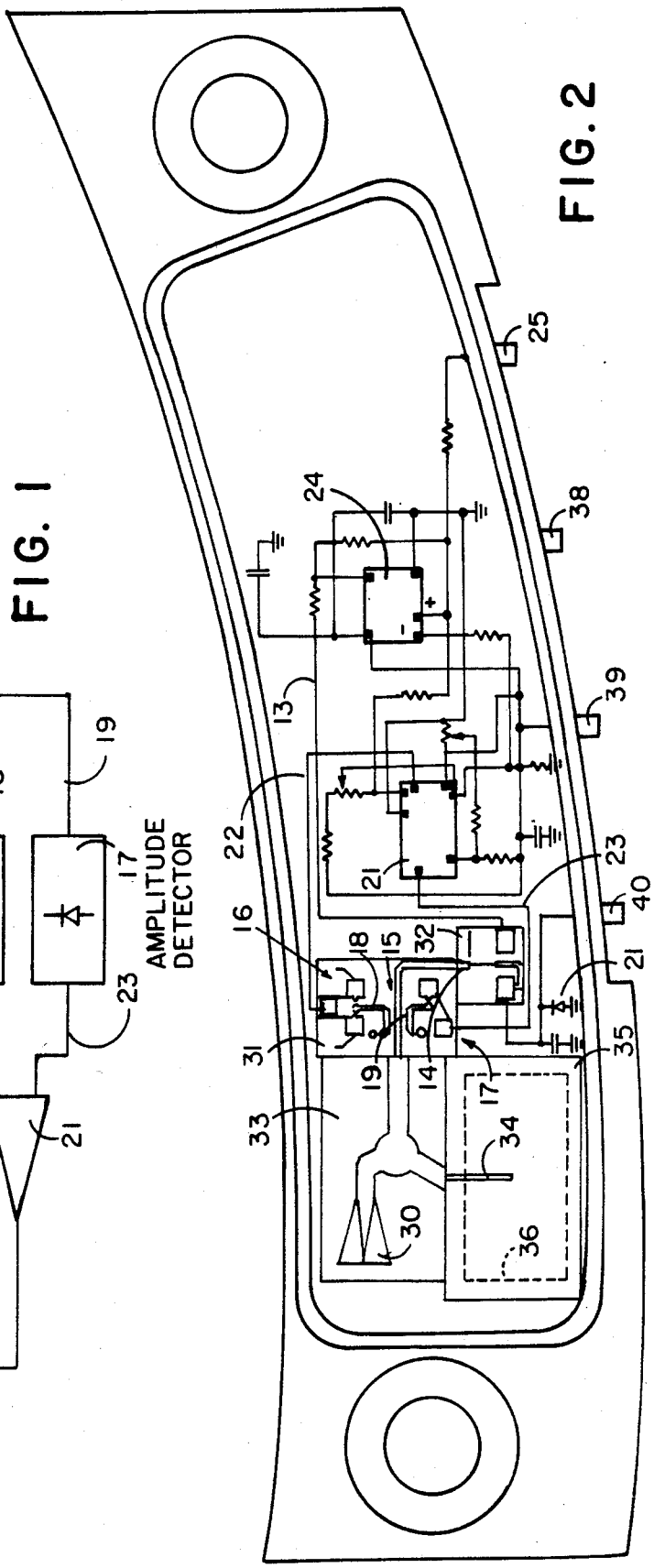
FIG. 2 is a plan view of a layout of a package according to the invention schematically representing some components.

Referring to FIG. 2, there is shown a plan view of a preferred physical layout of a system according to the invention, with some components schematically represented and some specific parameter values set forth. Certain elements in FIG. 2 may also not be described of FIG. 2; however, illustrated elements may bear reference symbols corresponding to those used in other figures where these elements are described in greater detail. The package includes detector/discriminator chip 31 comprising power divider 15, discriminator 16, amplitude detector 17 and transmission lines 18 and 19. Chip 31 is adjacent to VCO chip 32 comprising oscillatory circuit 11. Circulator chip 33 includes a circulator for transmitting energy from the VCO chip 32 to probe 34 is quartz probe chip 35 that covers the opening in waveguide 36. The circulator on circulator chip 33 transmits energy to probe 34 while energy transmitted from probe 34 is carried to terminating resistance 30.

Analog divider 21 comprises a multiplier chip, such as a type AD532 available from Analog Devices, having lines 22 and 23 from discriminator 16 and amplitude detector 17, respectively, connected to the indicated terminals on multiplier chip 21. Operational amplifier 24, may typically comprise an Analog Devices AD518 chip.

Terminal 25 receives the frequency controlling potential $V_T$, terminal 38 is grounded, terminal 39 receives a 24 volt potential and terminal 40 receives the Gunn diode biasing potential, typically 5 volts. Zener diode Z1 limiting the Gunn diode biasing potential at typically 5.5 volts.

Figure 3:
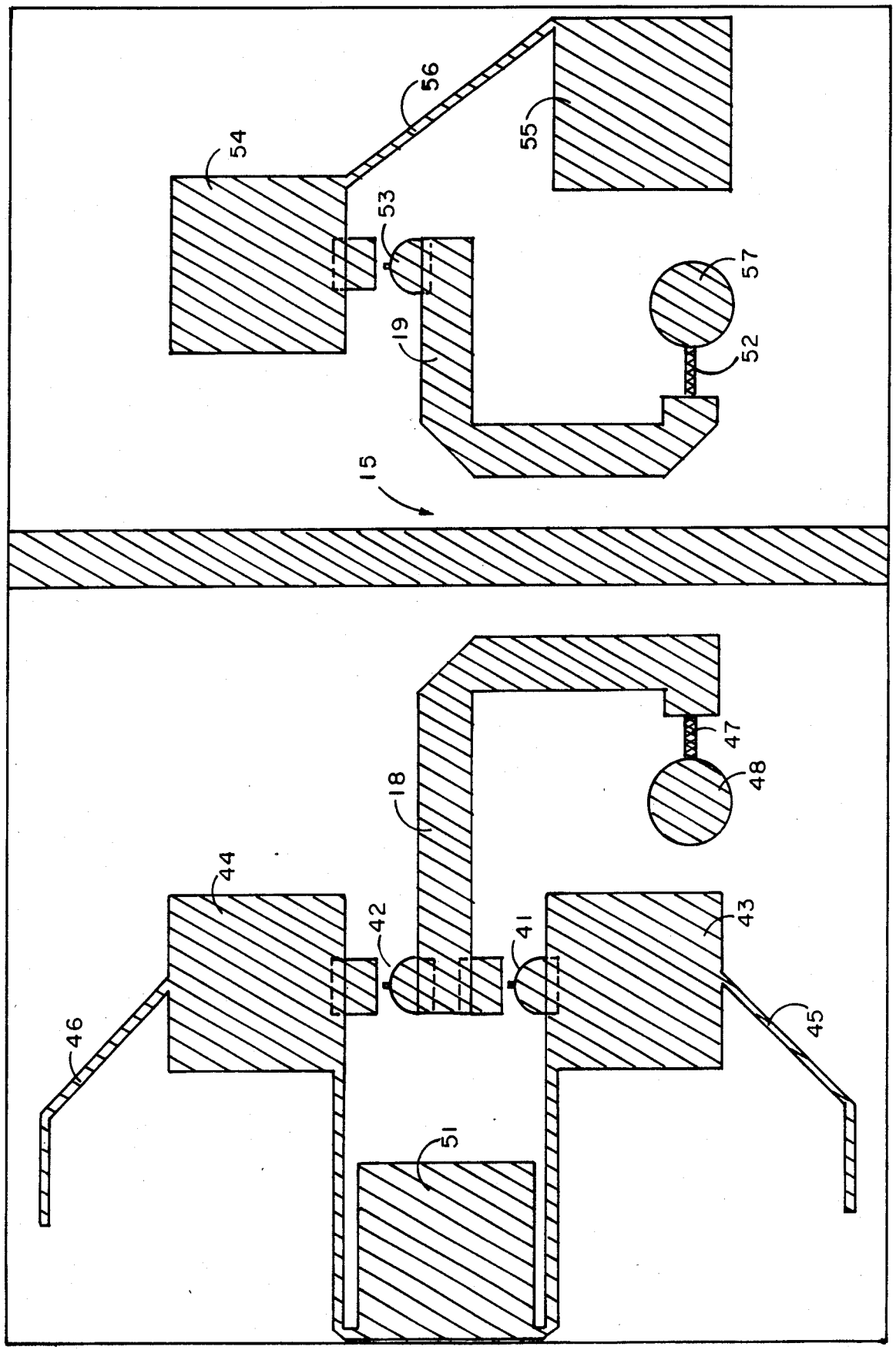
FIG. 3 is a plan view of the layout of a detector discriminator power divider chip according to the invention.

Referring to FIG. 3, there is shown the circuit-side layout of detector/discriminator chip 31. Power divider 15 comprises a directional coupler that delivers energy received from chip 37 to transmission lines 18 and 19. Transmission line 18 is connected to the junction of diodes 41 and 42 of discriminator 16. Square conducting pads 43 and 44 comprise capacitive elements that resqnate with inductive elements comprising conductive strips 45 and 46, respectively, to establish the staggered resonant circuits for establishing the S curve. A D.C. return to the conducting layer on the bottom of the chip is established through directional coupler terminating resistor 47 and via opening 48 filled with n material as discussed in greater detail below. Square conducting pad 51 provides the output from discriminator 16 carried on line 22 (FIGS. 1 and 2).

Transmission line 19 couples the other branch of power divider 15 to detecting diode 53. Square conducting pads 54 and 55 coact with inductive strip 56 to form a low-pass filter that provides a signal on pad 55 that is carried on line 23 (FIGS. 1 and 2). A D.C. return for detector diode 53 is established through directional coupler terminating resistor 52 connected through via opening 57 to the conducting layer on the bottom of the chip, typically being filled with n+ material as described below.

Figure 4:
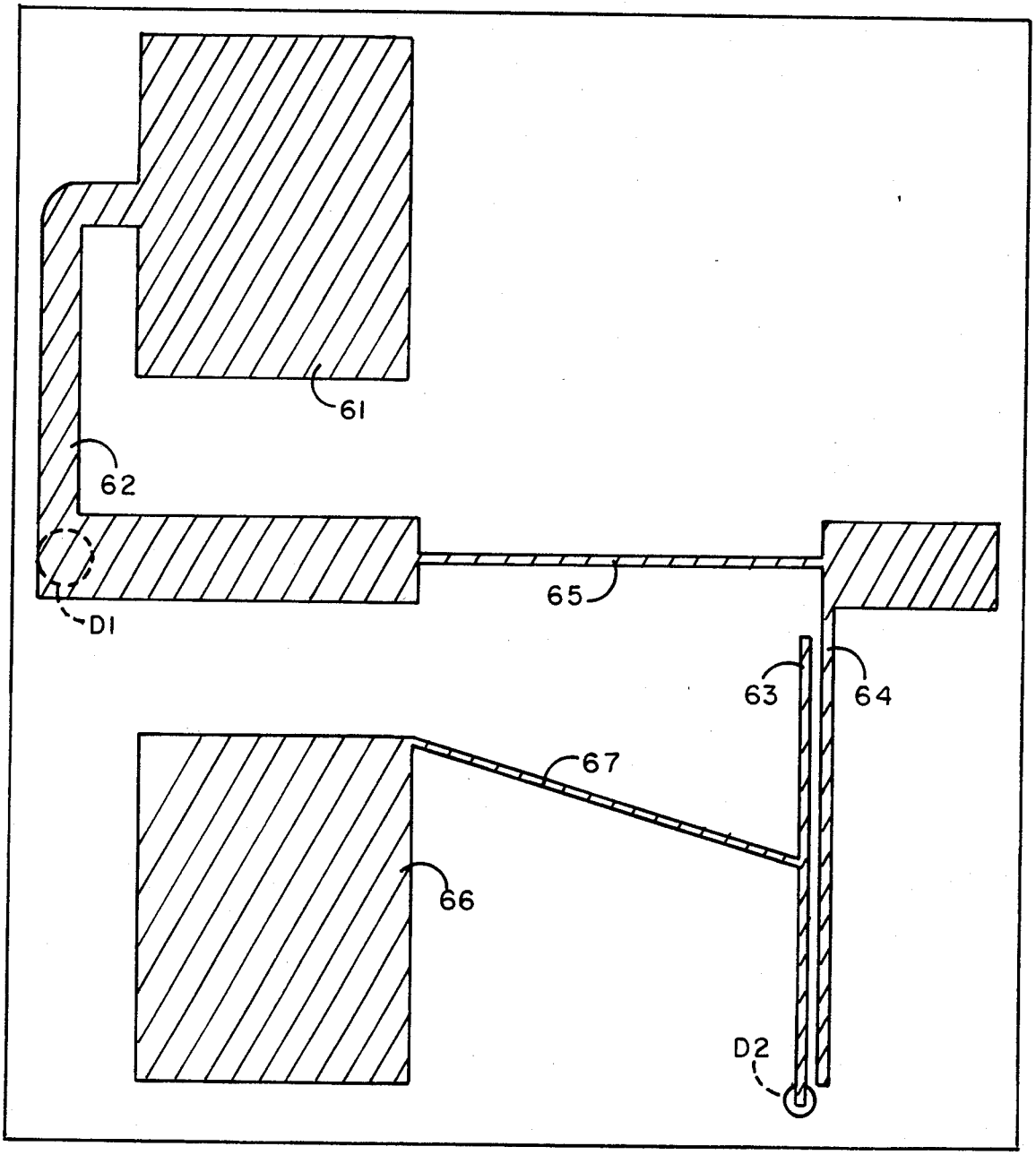
FIG. 4 is a plan view of the layout of a controlled oscillator chip according to the invention.

Referring to FIG. 4, there is shown the circuit-side layout of VCO chip 32. Gunn diode D1 is diffused into the side of the substrate and has one electrode connected to conducting pad 61 by inductive strip 62 that forms a low pass filter for carrying the Gunn diode bias from terminal 40 (FIG. 2). Varactor diode D2 is also diffused into the device side of the substrate and is coupled by strips 63 and 64, typically a quarter wavelength, to an inductive strip 65 connected to Gunn diode D1 to effectively form a resonant circuit of frequency related to the bias on varactor diode D2. Varactor diode D2 receives a biasing potential applied on pad 66 connected to strip 63 by inductive strip 67 to effectively form a low pass filter. Pad 66 is connected to line 13 (FIGS. 1 and 2).

Chips 31 and 32 typically comprise a semi-insulating substrate, such as gallium arsenide, with a conducting layer on the device side defining a ground plane.

In a process for making the invention for establishing connections between the two surfaces, it is convenient to etch through both sides, fill the etched cavity with n+ material, then grow n on the bottom surface, then etch leaving mesas for the Gunn and varactor diodes, then lay a conducting contact on the Gunn and a rectifying Schottky barrier contact for the varactor diode, then metalize the bottom surface, and lay the circuit on the top surface.

Figure 5A:
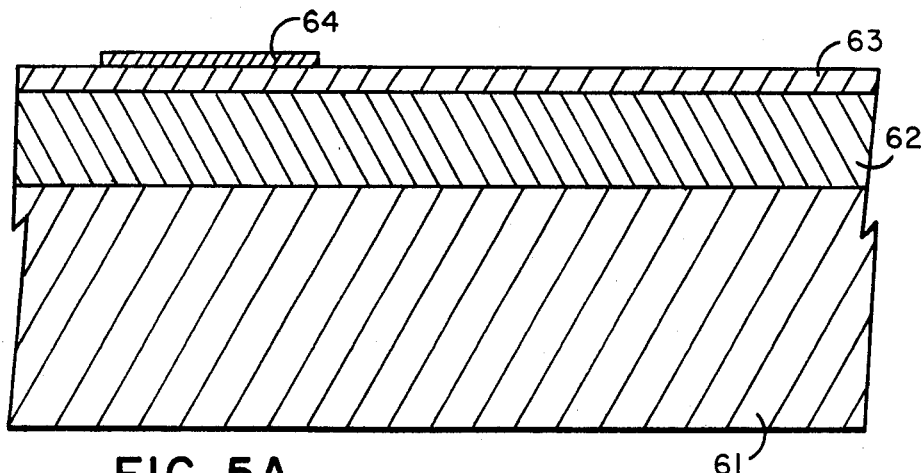
FIGS. 5A–5D illustrate the process of making monolithic circuits according to the invention.
Figure 5B:
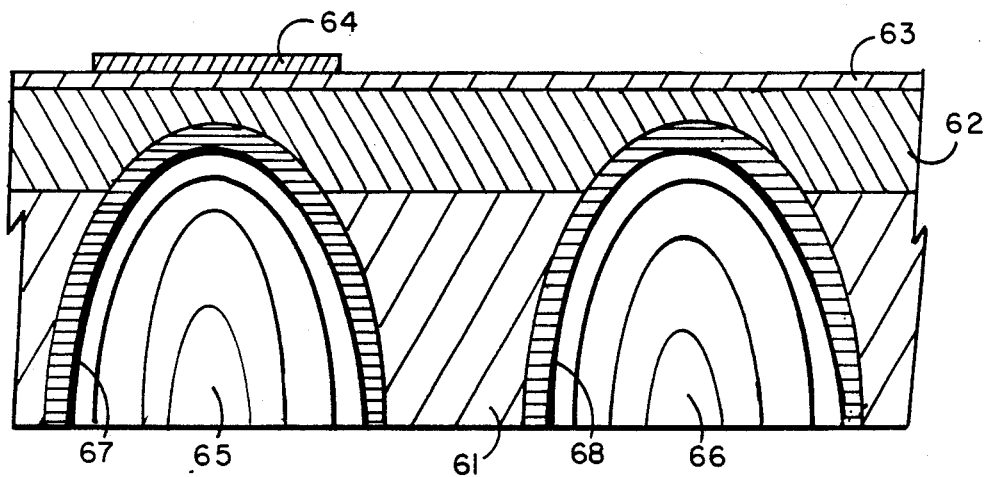
Figure 5C:
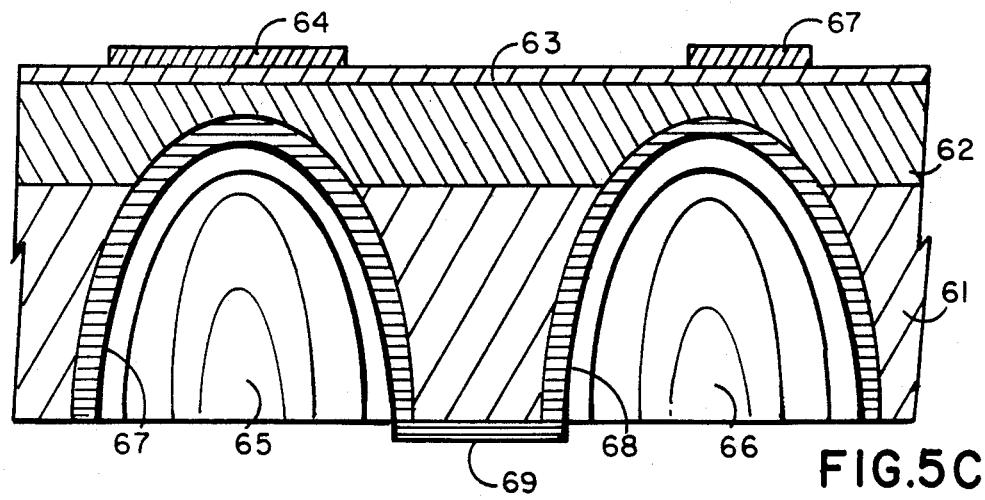

These techniques will be better understood from the following specific example of fabricating chip 32 as a monolithic circuit carrying both Gunn diode D1 and varactor diode D2. Referring to FIGS. 5A-5C, the process will be better understood. According to one aspect of the invention with specific reference to FIG. 5A, the process begins with a semi-insulating GaAs substrate with a grown thick n+ doped layer 62 approximately 15 micrometers thick and a thinner n− layer 63, typically three micrometers thick for a nominal 35 GHz Gunn device. The thickness and carrier concentration of the n− layer 63 is dependent upon the frequency of operation in accordance with known techniques. The n− layer 63 is used for both formation of Gunn diode D1 and varactor diode D2. The n+ layer 62 functions to establish contact to the two diodes. The semi-insulating substrate 61 functions to isolate the two diodes from each other and to be the substrate for the VCO circuitry. Ohmic metal 64 is then deposited on the device side of the substrate and patterned to form Gunn diode D1. A lift-off technique is used to establish the desired pattern in accordance with conventional techniques. The metal contact typically comprises a gold-germanium-nickel alloy deposited by conventional successive evaporations of a gold-germanium eutectic and nickel.

Referring to FIG. 5B, the next step involves etching via holes 65 and 66 from the circuit side of substrate 61 into the n+ epilayer 62. Via holes 65 and 66 are typically about 8 mils thick and stop within a 7 micrometer window. Ohmic metal is deposited in the vias to establish metal layers 67 and 68, and both the Gunn ohmic metal 67 and the varactor ohmic metal 68 are alloyed together over bridge 69.

Referring to FIG. 5C, Schottky metal 71 is deposited on n− layer 63 to form varactor diode D2.

Figure 5D:
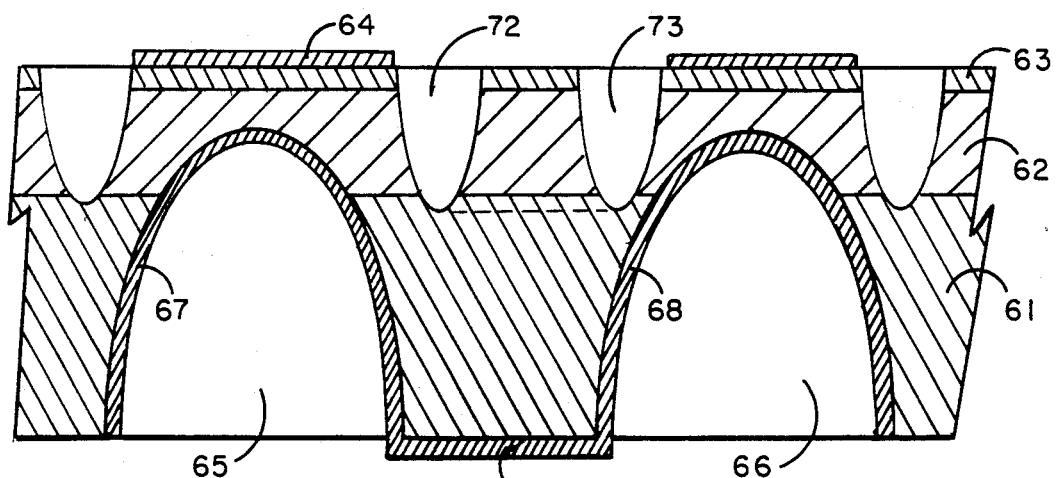

Diodes D1 and D2 are then electrically isolated by mesa etching between the devices, or by etching a donut or ring, like a moat 72 and 73, around each device as shown in FIG. 5D. circuitry may now be deposited on circuit side of the wafer in accordance with the pattern shown in FIG. 4.

The VCO is now complete, except for dicing into individual chips, bonding and packaging. The device side is preferably bonded to a heat sink package for better operation. To facilitate this bonding, metal is plated on the device side prior to bonding.

Figure 6A:
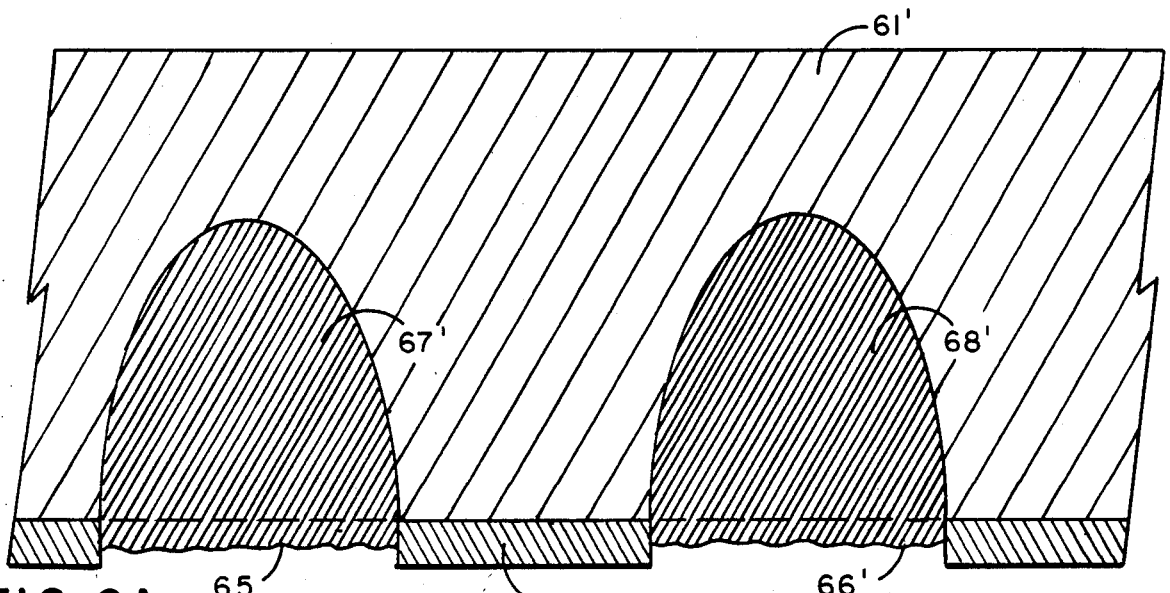
FIGS. 6A and 6B illustrate an alternate process for making monolithic circuits according to the invention.

Although the process just described may produce satisfactory chips, a preferred process according to the invention omits the need for stopping the etch within the window in the n+ region and provides enhanced mechanical strength. Referring to FIG. 6A, the via holes 65' and 66' are formed first through the circuit side of the semi-insulating GaAs substrate 61' free of epilayers. The via holes 65' and 66' may be formed with wet chemical etching or using reactive ion etching (RIE). The mask 60 used to define each via hole, silicon nitride or silicon dioxide, is also an inhibitor of epitaxial growth. Thus, by leaving the dielectric mask 60 after etching, epitaxial n+ material 67' and 68' may then be grown in the via holes 65' and 66', respectively, by a selective epitaxial process. Because the epi is selective, the growth rate is greatly enhanced so that there is no problem filling the 8–12 mil thick via opening with epi in a reasonable time. It does not matter that the via opening is overfilled because this surface is lapped and polished for subsequent processing.

Figure 6B:
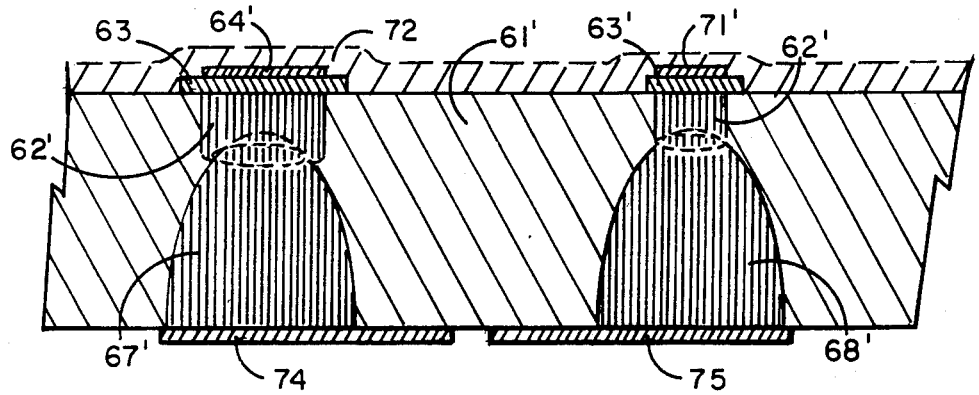

After the via side is polished, it is stained to delineate the via location so that the devices which are formed on the device side may be properly aligned. The wafer is now lapped and polished on the device side to approximately two mils greater than the final wafer thickness. Using the stained via openings as an alignment aid, the device side is now patterned for a "pocket etch." Referring to FIG. 6B, the pocket etch is similar to the via, but is much less deep. This approach helps to preserve lateral dimensional control. The pocket should be deep enough to penetrate the n+ filled via openings 65' and 66'. After the pocket is defined, n+ epi 63' is grown selectively in the pockets from the device side. The device side is now lapped and polished to the desired thickness, and the pocket is stained for an alignment aid.

The n+ vias are now complete and the n− layer 63' is grown in the conventional manner over the entire device side surface. The circuit side of the wafer is protected from growth with a dielectric layer, such as silicon nitride or silicon dioxide. The n− layer is then patterned over the pockets with the n− material removed from between these n+ regions. The n− material should overlap the n+ material to prevent short circuits or premature breakdown. Alternately, when the pocket dimensions are very small, a dielectric layer may be placed over the exposed n+ area.

Ohmic metal 64' may then be deposited on the Gunn diode n material and on the n+ vias. The same ohmic metal may also be used for the circuit definition 74, 75 on the circuit side. After the ohmic metal is alloyed, the Schottky metal 71' is deposited to form varactor diode D2.

The final step prior to dicing, bonding and packaging is to plate a thick layer of gold 72 upon the device side to aid as a heat sink and bonding metal. The order of the described steps may be varied if desired.

The process may be modified further with fewer steps by forming the via pocket n+ region in one step by making a very deep hole with the RIE or similar etch technique. Although dimensional control of the n+ region on the device side may be difficult, suitable etch recipes for the RIE, other die process etch techniques, such as reactive ion beam etching or sputter etching, may be used, and laser drilling techniques may be used. An important aspect of the process involves providing a channel for n+ growth for conducting material to connect the circuit side of the wafer with the Gunn and varactor diodes on the device side of the wafer.

It is also possible to establish contact between top and bottom surfaces by etching a via opening and metalizing the substrate around the via.

It is also within the principles of the invention to fabricate two or more of chips 31, 32 and 33 on the same substrate.

There has been described novel apparatus and techniques for frequency controlling and methods of manufacture characterized by numerous features and advantages. It is evident that those skilled in the art may now make numerous uses and modification of and departures from the specific embodiments described herein without departing from the inventive concepts. Consequently, the invention is to be construed as embracing each and every novel feature and every novel combination of features present in or possessed by the apparatus and techniques herein disclosed and limited solely by the spirit and scope of the appended claims.

What is claimed is:

1. Frequency controlling apparatus comprising, oscillatory circuit means having an output for providing a signal of controlled frequency and an input for receiving a frequency controlling signal and means responsive to said frequency controlling signal for establishing the frequency of the signal on said output, means coupled to said output for providing a feedback signal of frequency corresponding to and amplitude proportional to that of the signal on said output, discriminating means responsive to said feedback signal for providing a first signal of amplitude representative of both the frequency and amplitude of said feedback signal, amplitude detecting means responsive to said feedback signal for providing a second signal of amplitude representative of the amplitude of said feedback signal independently of the frequency thereof.

dividing means having first and second inputs for receiving said first and second signals respectively and providing a ratio signal representative of the ratio of said first signal to said second signal and of the frequency of said feedback signal independently of its amplitude, and means for coupling said ratio signal to said frequency controlling input to establish said frequency at a predetermined value.

2. Frequency controlling apparatus in accordance with claim 1 and further comprising, a source of a frequency designating signal, wherein said means for coupling said ratio signal to said frequency controlling input comprises, combining means having a first input coupled to the output of said dividing means for receiving said ratio signal and a second input coupled to said source of frequency designating potential to provide a combined signal representative of the difference between said ratio signal and said frequency designating signal as a frequency controlling signal.

3. Frequency controlling apparatus in accordance with claim 1 wherein said means for providing said feedback signal comprises a directional coupler loosely coupled to said output and further comprising, power dividing means having an input coupled to said directional coupler and first and second outputs coupled to the inputs of said frequency discriminating means and said amplitude detecting means respectively for dividing said feedback signal for delivery to said frequency discriminating means and said amplitude detecting means over parallel transmission paths.

4. Frequency controlling apparatus in accordance with claim 3 wherein said power dividing means, said discriminating means and said amplitude detecting means comprise a monolithic circuit, said monolithic circuit having first and second discriminator diodes each having first and second electrodes with the first electrodes connected together, first and second discriminator capacitive pads connected to said second electrodes of said first and second discriminator diodes respectively, first and second discriminator inductive strips connected to said first and second discriminator capacitive pads respectively and coacting therewith to form first and second resonant circuits having staggered resonant frequencies for establishing an S curve of said frequency discriminating means having a significant linear portion between the staggered resonant frequencies.

a conductor connecting one output of said power dividing means to the connected-together first electrodes.

an amplitude detector diode having one electrode connected to the other output of said power dividing means, capacitive and inductive conducting strips forming a low pass filter connected to the other electrode of said amplitude detecting diode, a conductive layer on the bottom of said substrate, a conducting pad on the top surface connected to the bottom surface conducting layer, an inductive conducting strip interconnecting the latter conducting pad and the connected together discriminator diode first electrodes establishing a d.c. path to said bottom conducting layer, and first and second discriminator output conducting pads connected to said first and second discriminator capacitive pads respectively by inductive conducting strips.

5. Frequency controlling apparatus in accordance with claim 1 wherein said oscillatory circuit means comprises a monolithic circuit, said monolithic circuit comprising a substrate having a device side and a circuit side.

said device side having a Gunn diode and a varactor diode.

said device side having an electrically and thermally conducting layer interconnecting electrodes of said Gunn and varactor diodes.

via openings extending from said circuit side and carrying conducting material for establishing electrical contact to an electrode of said Gunn diode and an electrode of said varactor diode.

and conducting material on said circuit side intercoupling said Gunn diode and said varactor diode while forming resonant circuit means for establishing a controllable frequency of said oscillatory circuit means.

6. Frequency controlling apparatus in accordance with claim 5 wherein said conducting material comprises n+ material filling said via openings.

* * * * *

UNITED STATES PATENT AND TRADEMARK OFFICE
CERTIFICATE OF CORRECTION

PATENT NO. : 4,644,296
DATED : February 17, 1987
INVENTOR(S) : Ian Crossley, et al It is certified that error appears in the above-identified patent and that said Letters Patent is hereby corrected as shown below:

On the title page assignee should read

--(73) Assignees: Aerojet-Alpha, a joint venture consisting of Aerojet Electro-Systems Company, a division of Aerojet-General Corporation, and Alpha Industries, Inc. --.

Signed and Sealed this

Twenty-ninth Day of September, 1987

Attest:

DONALD J. QUIGG

Attesting Officer     Commissioner of Patents and Trademarks

UNITED STATES PATENT AND TRADEMARK OFFICE
CERTIFICATE OF CORRECTION

PATENT NO. : 4,644,296

DATED : February 17, 1987

INVENTOR(S) : Ian Crossley, Daniel Donoghue, Robert Goldwasser, John Miley, Frank Spooner It is certified that error appears in the above-identified patent and that said Letters Patent is hereby corrected as shown below:

Title page:

The third inventor's name should read -- Robert Goldwasser --.

This certificate supersedes Certificate of Correction issued June 30, 1987.

Signed and Sealed this

Sixteenth Day of February, 1988

Attest:

DONALD J. QUIGG

*Attesting Officer*    *Commissioner of Patents and Trademarks*